(12) United States Patent
Dawood

(10) Patent No.: US 10,140,728 B1
(45) Date of Patent: Nov. 27, 2018

(54) ENCODER WITH IMAGE FILTERING AND ASSOCIATED METHODS

(71) Applicant: Citrix Systems, Inc., Fort Lauderdale, FL (US)

(72) Inventor: Muhammad Dawood, Wycombe (GB)

(73) Assignee: Citrix Systems, Inc., Fort Lauderdale, FL (US)

( * ) Notice: Subject to any disclaimer, the term of this patent is extended or adjusted under 35 U.S.C. 154(b) by 0 days.

(21) Appl. No.: 15/234,336

(22) Filed: Aug. 11, 2016

(51) Int. Cl.
*G06T 9/00* (2006.01)
*G06T 5/20* (2006.01)
*H03M 7/46* (2006.01)

(52) U.S. Cl.
CPC .......... *G06T 9/00* (2013.01); *G06T 5/20* (2013.01); *H03M 7/46* (2013.01)

(58) Field of Classification Search
USPC .......... 345/427; 348/426.1, 294; 358/1.15, 358/3.27, 504, 518; 375/E7.135, E7.137; 382/165, 167, 232; 708/323
See application file for complete search history.

(56) References Cited

U.S. PATENT DOCUMENTS

| | | | | |
|---|---|---|---|---|
| 5,563,726 A * | 10/1996 | Suzuki | ...................... | H04N 1/64 348/642 |
| 5,805,478 A * | 9/1998 | Kim | .................. | G11B 20/10009 708/323 |
| 6,701,010 B1 * | 3/2004 | Katsuyama | ............ | G06K 9/342 382/165 |
| 7,031,540 B2 * | 4/2006 | De Bonet | ............ | H04N 19/176 375/E7.135 |
| 7,072,521 B1 * | 7/2006 | Cadwell | ............... | H04N 19/503 375/E7.137 |
| 7,447,350 B2 * | 11/2008 | Akaishi | ..................... | H04N 1/58 358/504 |
| 8,331,664 B2 * | 12/2012 | Strom | ....................... | G06T 9/00 348/426.1 |
| 8,553,301 B2 * | 10/2013 | Tamura | .................. | H04N 1/644 358/518 |
| 8,659,690 B2 * | 2/2014 | Hatano | .................. | H04N 5/335 348/294 |

(Continued)

OTHER PUBLICATIONS

Wu et al. "An improved two-dimensional run-length encoding scheme and its application" International Journal of Signal Processing, Image Processing and Pattern Recognition: vol. 9, No. 4, 2016: pp. 339-346.

(Continued)

*Primary Examiner* — Xuemei Chen
(74) *Attorney, Agent, or Firm* — Allen, Dyer, Doppelt + Gilchrist, PA

(57) ABSTRACT

An encoder includes a processor and a memory coupled thereto. A digital image to be encoded is stored in the memory. The digital image includes an array of pixels, with each pixel having an RGB color value associated therewith. Image filtering is performed on the digital image and includes calculating an RGB Euclidean geometric distance between a current pixel and a prior pixel, comparing the calculated RGB Euclidean geometric distance to a threshold, and changing the RGB color value of the current pixel to the same RGB color value as the prior pixel when the calculated RGB Euclidean geometric distance is less than the threshold. Run length encoding is performed on the filtered digital image.

19 Claims, 4 Drawing Sheets

(56) References Cited

U.S. PATENT DOCUMENTS

| | | | | |
|---|---|---|---|---|
| 8,805,096 | B2* | 8/2014 | Gilgen | H04N 19/105 |
| | | | | 382/232 |
| 8,908,247 | B2* | 12/2014 | Nakajo | H04N 1/411 |
| | | | | 358/426.01 |
| 9,367,764 | B2* | 6/2016 | Sakamaki | H04N 1/622 |
| 9,449,362 | B2* | 9/2016 | Poddar | G06T 1/60 |
| 9,756,288 | B2* | 9/2017 | Huber | G06T 11/60 |
| 2003/0086118 | A1* | 5/2003 | Miller | G06T 9/00 |
| | | | | 358/1.15 |
| 2014/0071131 | A1* | 3/2014 | Kitago | H04N 13/0011 |
| | | | | 345/427 |
| 2015/0093027 | A1* | 4/2015 | Hasegawa | G06T 5/002 |
| | | | | 382/167 |
| 2016/0119503 | A1* | 4/2016 | Yamada | H04N 1/4092 |
| | | | | 358/3.27 |
| 2017/0039683 | A1* | 2/2017 | Yamamoto | G06F 3/04842 |

OTHER PUBLICATIONS

Neto et al. "The use of euclidean geometric distance on RGB color space for the classification of sky and cloud patterns" Journal of Atmospheric and Oceanic Technology: vol. 27, 2010: pp. 1504-1517.

\* cited by examiner

ENCODER WITH IMAGE FILTERING AND ASSOCIATED METHODS

TECHNICAL FIELD

The present disclosure relates to encoders, and more particularly, to a run length encoder with image filtering to improve lossless encoding efficiencies of a bitmap without any perceptible loss in quality, and associated methods.

BACKGROUND

Computing systems are capable of running a large variety of software applications and platforms. A computing system can provide an operating system allowing applications executing on the computing system to access and interact with hardware components of the computing system. Through this interaction, the software applications can accept user input and provide output, which can be presented to the user through a graphical user interface presented on a display device. Additionally, the output can be forwarded to a remote computing device.

Remote computing technologies allow users to use a computing system without being physically located at the computing system. Through remote access, users can connect to a remote computing system over a public or private network. The remote computing system may be at a data center, for example. The user can use a local computing system to send input to the remote computing system and the remote computing system can respond. Although not physically present at the remote computing system, the user can interact with the remote computing system as though the user was using the system directly.

Virtualization technologies have become widely used for sharing limited computer hardware resources. In a hardware virtualization environment, sometimes also referred to as a platform virtualization environment, one or more virtual machines can simulate a host computer with its own operating system. In particular, software executed on these virtual machines can be separated from the underlying hardware resources. As a result, virtual machines running on a same host computer can each have its own operating system. For example, a computer that is running Microsoft Windows operating system may host a virtual machine that simulates a computer running a Linux operating system, based on which Linux-based software can be executed.

Transmitting display frames across a network takes time. For example, when the user's computing device is connected over a wide area network, there might be latency and bandwidth limitations. A variety of compression techniques are used to compress the display frames for transmission so as to use less bandwidth. The compressed display frames are sent from the remote computing device to the user's computing device. The user's computing device then decompresses the received display frames for display.

A graphics encoder decomposes the display frames into lossless regions and lossy regions. Lossless regions include text or other areas that require pixel perfect quality for readability. Lossy regions include photographic or video content where quality can be sacrificed in an effort to reduce bandwidth.

Lossless regions may be encoded using a two-dimensional run length encoder (2DRLE). The output of this encoder, once decoded, produces exactly the same set of pixels as the original input, i.e., it is a lossless encoder.

A large proportion of imagery encoded by a 2DRLE consists of clear type text. Clear type text attempts to improve the appearance and smoothness of text on certain types of displays by varying the intensity of characters at the sub-pixel level. While this can produce visually pleasing results, many unique pixel shades are generated in addition to what would normally be considered 2-tone text.

From a run length encoding perspective, this added complexity results in less efficient encodings due to the lack of repeating pixels and also the extra bits required to code the unique pixel colors. Consequently, there is a need to improve the encoding efficiency of run length encoding.

SUMMARY

An encoder includes a processor and a memory coupled thereto. A digital image to be encoded is stored in the memory. The digital image includes an array of pixels, with each pixel having an RGB color value associated therewith. Image filtering is performed on the digital image and includes calculating an RGB Euclidean geometric distance between a current pixel and a prior pixel, comparing the calculated RGB Euclidean geometric distance to a threshold, and changing the RGB color value of the current pixel to the same RGB color value as the prior pixel when the calculated RGB Euclidean geometric distance is less than the threshold. Run length encoding is performed on the filtered digital image.

The image filtering removes a portion of shade variations in the digital image before being encoded. Each removed shade variation is replaced by a run of pixels having the same RGB color value, the results of which are imperceptible to the human eye at normal viewing levels. Runs of repeating pixels advantageously increase the efficiency of the encoder since fewer bits are to be encoded, which also reduces the bandwidth while offering near-lossless imagery.

When the calculated RGB Euclidean geometric distance is greater than the threshold, then the processor leaves the color value of the current pixel unchanged.

The processor may be further configured to limit how many successive pixels are being changed to have the same RGB color value. The successive pixels may have the same RGB color value in a horizontal direction and/or in a vertical direction.

The processor may be configured to perform the image filtering in two-dimensions. The processor may be configured to perform the image filtering in a top-left to bottom-right order.

The processor may be configured to calculate the RGB Euclidean geometric distance based on an approximation. The approximation may be based on the following equation:

$$\text{Distance} = W1|R_X - R_Y| + W2|G_X - G_Y| + W3|B_X - B_Y|$$

where $R_X$, $G_X$ and $B_X$ are the red, green and blue color values for the prior pixel, where $R_Y$, $G_Y$ and $B_Y$ are the red, green and blue color values for the current pixel, and W1, W2 and W3 are weighting factors.

Another aspect is directed to a method for encoding a digital image. The method comprises operating a processor and a memory coupled thereto to perform steps that include storing the digital image in the memory, with the digital image comprising an array of pixels, and with each pixel having an RGB color value associated therewith. The method further comprises performing image filtering on the digital image comprising calculating an RGB Euclidean geometric distance between a current pixel and a prior pixel, comparing the calculated RGB Euclidean geometric distance to a threshold, and changing the RGB color value of the current pixel to the same RGB color value as the prior pixel when the calculated RGB Euclidean geometric distance is less than the threshold. Run length encoding may then be performed on the filtered digital image.

Yet another aspect is directed to a non-transitory computer readable medium having a plurality of computer executable instructions for causing a system to perform steps that include storing a digital image to be encoded, with the digital image comprising an array of pixels, and with each pixel having an RGB color value associated therewith. Image filtering may be performed on the digital image comprising calculating an RGB Euclidean geometric distance between a current pixel and a prior pixel, comparing the calculated RGB Euclidean geometric distance to a threshold, and changing the RGB color value of the current pixel to the same RGB color value as the prior pixel when the calculated RGB Euclidean geometric distance is less than the threshold. Run length encoding may then be performed on the filtered digital image.

DETAILED DESCRIPTION

The present disclosure will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
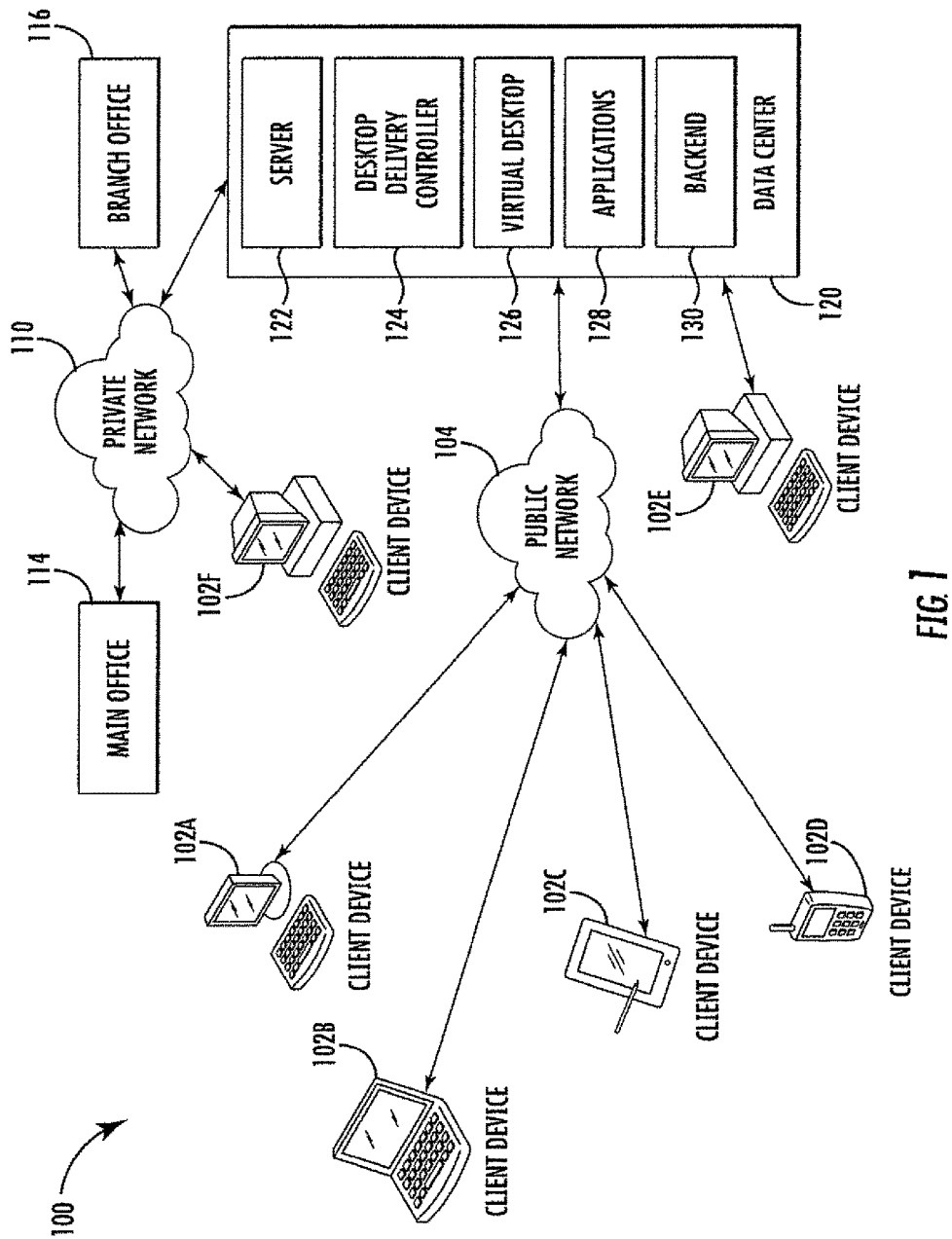
FIG. 1 is a block diagram of a virtual network environment consistent with embodiments of the present disclosure.

FIG. 1 is a block diagram of an exemplary network environment 100. While exemplary network environment 100 is directed to a virtual network environment, it is appreciated that the network environment can be any type of network that communicates using packets. Network environment 100 can include client devices 102A-102F, a public network 104, a private network 110, a main office 114, a branch office 116, and a data center 120.

The client devices 102A-102F, which are collectively referred to by reference number 102, are devices that can acquire remote services from the data center 120. The client devices 102A-102F can communicate with the data center 120 either directly (e.g., client device 102E) or indirectly through the public network 104 (e.g., client devices 102A-102D) or the private network 110 (e.g., client device 102F). In some embodiments, the main office 114 and the branch office 116 can also include one or more client devices that are similar to client devices 102A-102F. The main office 114 can be located, for example, in a principal place of business of a company. The branch office 116 can be located, for example, remote to the main office 114. In some embodiments, the client devices of the main office 114 and the branch office 116 can also acquire remote services from the data center 120 through, for example, the private network 110.

When a client device 102 communicates through the public network 104 or the private network 110, a communication link can be established. For example, a communication link can be established by the public network 104, thereby providing a client device (e.g., client devices 102A-102D) access to the data center 120. A communication link can also be established by the private network 110, thereby providing client device 102F, the main office 114 and/or the branch office 116 accesses to the data center 120. While the client devices 102A-102D are portrayed as a computer (e.g., client devices 102A), a laptop (e.g., client device 102B), a tablet (e.g., client device 102C), and a mobile smart phone (e.g., client device 102D), it is appreciated that client device 102 could be any type of device (e.g., such as a smartwatch or any other wearable device) that communicates packets to and from the data center 120.

The public network 104 and the private network 110 can be any type of network, such as a wide area network (WAN), a local area network (LAN), or a metropolitan area network (MAN). As an example, the WAN can be the Internet or the World Wide Web, and the LAN can be a corporate Intranet. The public network 104 and the private network 110 can be a wired network, a wireless network, or a combination of both.

The data center 120 can be a central repository, either physical or virtual, for the storage, management, and dissemination of data and information pertaining to a particular public or private entity. The data center 120 can be used to house computer systems and associated components, such as one or more physical servers, virtual servers, and storage systems. The data center 120 can include, among other things, one or more servers (e.g., server 122), a desktop delivery controller 124, a virtual desktop 126, applications 128, and a backend system 130.

The server 122 can be an entity represented by an IP address and can exist as a single entity or a member of a server farm. The server 122 can be a physical server or a virtual server. In some embodiments, the server 122 includes a hardware layer, an operating system, a communication subsystem, and a hypervisor creating or managing one or more virtual machines. The server 122 can provide one or more services to an endpoint.

These services can include providing one or more applications 128 to one or more endpoints (e.g., client devices 102A-102F). For example, one or more applications 128 can include Windows™ or SAP™ based applications and computing resources. Via the communication subsystem, the server 122 can communicate with other devices (e.g., client devices 102) through various types of networks (e.g., private network 110 and public network 104). The server 122 can include features provided in other components of the data center 120, such as the virtual desktop 126, the applications 128, and/or the desktop delivery controller 124. In some embodiments, a client device 120 acts as server 122 by providing functionality consistent with the server 122.

The desktop delivery controller 124 can be a device that enables delivery of services, such as the virtual desktops 126 to the client devices (e.g., client devices 102A-102F). The desktop delivery controller 124 can provide functionality required to manage, maintain, and optimize all virtual desktop communications. In some embodiments, the desktop delivery controller 124 can control, manage, maintain, or optimize the provisioning of applications 128.

In some embodiments, one or more virtual desktops 126 provide one or more applications 128. The virtual desktops 126 can include hosted shared desktops allowing multiple users to access a single shared remote-desktop-services desktop, virtual desktop infrastructure desktops allowing each user to have their own virtual machine, streaming disk images, a local virtual machine, individual applications (e.g., one or more applications 128), or a combination thereof. Users can interact with one or more of the virtual desktops 126 through the client device 102. In some embodiments, the virtual desktop 126 responds to user input by providing an updated visual display forwarded from the virtual desktop to the client device.

The backend system 130 can be a single or multiple instances of computer networking hardware, appliances, or servers in a server farm or a bank of servers. The backend system 130 can interface directly or indirectly with the server 122. For example, the backend system 130 can include Microsoft™ Active Directory, which can provide a number of network services, including lightweight directory access protocol (LDAP) directory services, Kerberos-based authentication, domain name system (DNS) based naming and other network information, and synchronization of directory updates among several servers.

The backend system 130 can also include, among other things, an Oracle backend server, a SQL Server backend, and/or a dynamic host configuration protocol (DHCP) server. The backend system 130 can provide data, services, or a combination of both to the data center 120, which can then provide that information via varying forms to the client devices 102 or the branch office 140.

Figure 2:
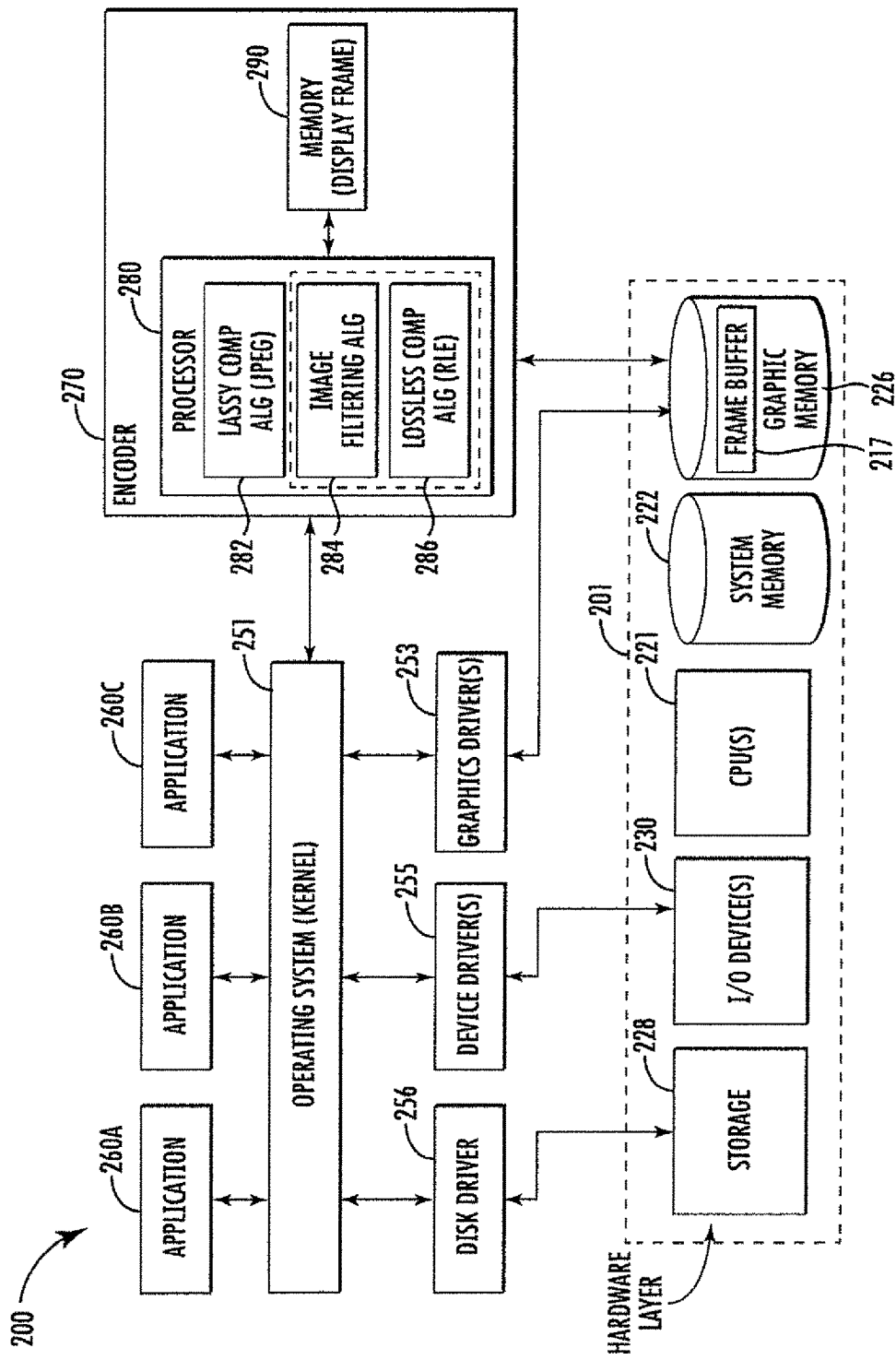
FIG. 2 is a block diagram of a computing device with an encoder with image filtering consistent with embodiments of the present disclosure.

FIG. 2 is a block diagram of an exemplary computing device 200, consistent with embodiments of the present disclosure. The computing device 200 can be the server 122 in the data center 120 as shown in FIG. 1. The computing device 200 can include storage 228, I/O device(s) 230, CPU(s) 221, system memory 222, frame buffer 217, and graphic memory 226 as part of a hardware layer 201. The computing device 200 can execute an operating system 251. Additionally, the computing device 200 can execute applications 260A-260C. The applications 260A-206C can use functionality provided by the operating system 251 to interact with the hardware layer 201 provided by the computing device 200.

The operating system 251 can use device drivers to communicate with components in the hardware layer 201. For example, the operating system 251 can use a disk driver 256 to interact with the storage 228, device driver(s) 255 to interact with various I/O devices 230, and a graphics driver 253 to interact with the frame buffer 217, the graphic memory 226, and other aspects of the graphics system. The computing device 200 may contain many additional device drivers to facilitate interaction with other hardware not pictured.

Additionally, the operating system 251 can interact with components designed to perform different tasks related to enhance the computing device 200. The encoder 270 communicates with the operating system 251 and the frame buffer 217 to further process display frames produced by the operating system 251. The encoder 270 can provide special functionality to optimize transmission of the display frames to remote computing devices (e.g., client device 102).

One embodiment of the encoder 270 may be found in U.S. patent application Ser. No. 14/670,283, which is incorporated herein by reference in its entirety, and is assigned to the current assignee of the present disclosure. This embodiment of the encoder 270 allows for detection of rapidly changing regions of a display frame and encoding of those rapidly changing regions using a compression algorithm designed to handle transient visual data.

The illustrated encoder 270 includes a processor 280 and a memory 290 coupled thereto. The encoder 270 decomposes the display frames into lossless regions and lossy regions. Lossless regions include text or other areas that require pixel perfect quality for readability. Lossy regions include photographic or video content where quality can be sacrificed in an effort to reduce bandwidth.

The processor 280 executes a lossy compression algorithm 282 to encode the lossy regions, and a lossless compression algorithm 286 to encode the lossless regions. An example lossy compression algorithm is the Joint Photographic Experts Group (JPEG) format. An example lossless compression algorithm is the two-dimensional Run Length Encoding (2DRLE). Prior to executing the lossless compression algorithm 286, the processor 280 executes an image filtering algorithm 284 on the lossless regions to be encoded.

As will be discussed in greater detail below, the image filtering algorithm 284 improves lossless encoding efficiencies without any perceptible loss in quality. As discussed in the background, a large proportion of imagery encoded by run length encoding consists of clear type text.

Figure 3:
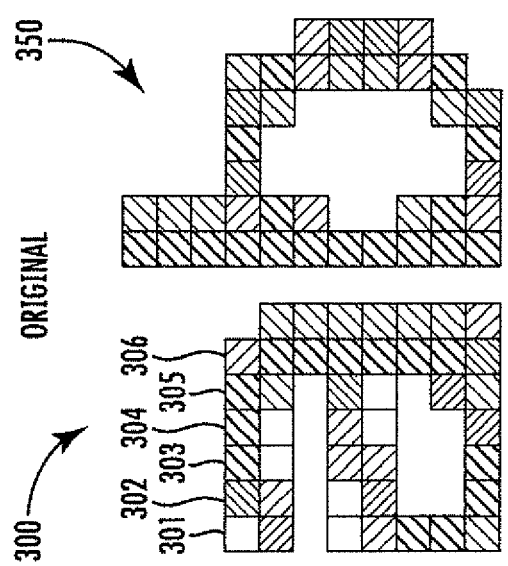
FIG. 3 is a bitmap of the letters "ab" with clear type text prior to image filtering with the encoder illustrated in FIG. 2.

Clear type text attempts to improve the appearance and smoothness of text on certain types of displays by varying the intensity of characters at the sub-pixel level, as illustrated by the bitmap letters "ab" in FIG. 3. While this can produce visually pleasing results, many unique pixel shades are generated in addition to what would normally be considered 2-tone text.

From a run length encoding perspective, this added complexity results in less efficient encodings due to the lack of repeating pixels and also the extra bits required to code the unique pixel colors. The encoder 270 in accordance with the present disclosure is configured to execute the image filtering algorithm 284 on the digital image to be encoded to remove some of the shade variations, the results of which are imperceptible to the human eye at normal viewing levels.

The image filtering technique removes some of the shade variations by calculating an RGB (red, green, blue) Euclidean geometric distance between a current pixel and a prior pixel, comparing the calculated RGB Euclidean geometric distance to a threshold, and changing the RGB color value of the current pixel to the same RGB color value as the prior pixel when the calculated RGB Euclidean geometric distance is less than the threshold. When the calculated RGB Euclidean geometric distance is greater than the threshold, then the RGB color value of the current pixel is left unchanged. Run length encoding is then performed on the filtered digital image.

The encoder 270 with the image filtering algorithm 284 advantageously removes shade variations of neighboring pixels to reduce complexity of the overall image and to also increase the number of repeating pixels, which is also referred to as a run. In other words, all of the pixels in a run will have the same RGB color value.

Still referring to FIG. 3, the bitmap letters "a" 300 and "b" 350 are part of a digital image to be encoded. The digital image is made up of an array of pixels, with each pixel having an RGB color value associated therewith. The image filtering algorithm 284 examines the pixels of each letter in a top-left to bottom-right order.

The following is a more detailed description of the image filtering algorithm 284 applied to the top row of the letter "a" 300. The top-left most pixel of the letter "a" 300 is a white pixel 301 followed by a cream pixel 302, and then followed by a sequence of brown and blue pixels 303-306.

The image filtering algorithm 284 starts with the left-most white pixel 301 represented by RGB color value 0xFFFFFF, and then moves to the next successive pixel, which is the cream pixel 302 with RGB color value 0xFFE5C6. Since these pixels are not the same (i.e., not part of a run), further checks are done to see whether the pixels can be combined.

The first check involves calculating a separation distance between the RGB color values of the white and cream pixels 301, 302. The separation distance is known as the RGB Euclidian geometric distance. The RGB Euclidian distance between any two pixels X and Y is defined as follows:

$$\text{Distance} = \sqrt{((R_X - R_Y)^2 + (G_X - G_Y)^2 + (B_X - B_Y)^2)}$$

R, G and B are the red, green and blue component values of the pixels X and Y. Using the two pixels above, X as the white pixel 301 and Y as the cream pixel 302, the RGB Euclidian geometric distance is calculated as follows:

$$\text{Distance} = \sqrt{((0xFF - 0xFF)^2 + (0xFF - 0xE5)^2 + (0xFF - 0xC6)^2)}$$
$$= 62.64$$

Calculating the distance in the above manner involves squaring and square root operations, which is costly in terms of processor or CPU cycles. To help mitigate this, an approximation to the RGB Euclidian geometric distance may alternatively be calculated instead. Such an approximation is as follows:

$$\text{Approx. Distance} = W1|R_X - R_Y| + W2|G_X - G_Y| + W3|B_X - B_Y|$$

The vertical lines in the equation represents the modulus function, which means absolute value. Also, respective bias weightings W1, W2, W3 may be applied to each R, G and B difference. Example bias weightings are as follows: W1=2, W2=4 and W3=2.

The green distance has a larger bias weighting (4) than the respective bias weightings (3), (2) for the red and blue components. Humans are more perceptive to changes in the green component, and less so in the red and blue components, so the distance is biased accordingly. The respective bias weightings for the R, G, and B components are examples and are not to be limiting.

Using the above pixel values, the approximate RGB Euclidian geometric distance is calculated as follows:

$$\text{Approx. Distance} = 3|0xFF - 0xFF| + 4|0xFF - 0xE5| + 2|0xFF - 0xC6|$$
$$= 218$$

The threshold is currently set to 142, and since 218 is greater than 142, no further checks are done and the cream pixel 302 will not be turned into a white pixel 301. At this point in the image filtering algorithm 284, the cream pixel 302 is the current pixel and the white pixel 301 is the prior pixel.

The image filtering algorithm 284 now moves onto the next pixel (brown pixel 303) and performs the same steps as above, except this time with the left adjacent cream pixel 302. At this point in the algorithm 284, the brown pixel 303 becomes the current pixel and the cream pixel 302 becomes the prior pixel. The RGB Euclidian geometric distance is calculated between the current pixel and the prior pixel. In this example, the RGB Euclidian geometric distance is also above the threshold, so the pixels are not combined.

The image filtering algorithm 284 now moves onto the next pixel (dark brown/blue pixel 304) and performs the same steps as above, except this time with the left adjacent brown pixel 303. At this point in the algorithm 284, the dark brown/blue pixel 304 becomes the current pixel and the brown pixel 303 becomes the prior pixel. The RGB Euclidian geometric distance is calculated between the current pixel and the prior pixel. This time, the RGB Euclidian geometric distance is below the threshold. As a result, the RGB color value of the dark brown/blue pixel 304 is changed to the same RGB color value of the left adjacent brown pixel 303. Pixels 303 and 304 now have the same RGB color value and are part of a run.

The image filtering algorithm 284 limits how many successive pixels are being changed to have the same RGB color value. This is needed to prevent pixels being combined indefinitely and losing all detail in the image. In the illustrated example, the limit on how many left-most pixels can be combined to have the same RGB color value in a run is 4. At this point, the algorithm 284 checks to ensure that the maximum left pixel combine count (i.e., 4 pixels) has not been exceeded.

Prior to this point in the algorithm 284, the left pixel run counter=0 since the calculated RGB Euclidian geometric distances for pixels 301/302 and 302/303 exceeded the threshold. The left pixel run counter is now incremented to 1 since the dark brown/blue pixel 304 is the first pixel to be combined with a left neighboring pixel (brown pixel 303).

The image filtering algorithm 284 now moves onto the next pixel (dark blue pixel 305) and performs the same steps as above, except this time with the left adjacent dark brown/blue pixel 304. At this point in the algorithm 284, the dark blue pixel 305 becomes the current pixel and the dark brown/blue pixel 304 becomes the prior pixel. The RGB Euclidian geometric distance is calculated between the current pixel and the prior pixel and is also below the threshold. Since the maximum left pixel combine counter has not been exceeded, the RGB color value of the dark blue 305 is changed to the RGB color value of the run. The left pixel run counter is incremented to 2.

As noted above, all of the pixels in a run will have the same RGB color value. The RGB color value of the dark blue pixel 305 is changed to the same RGB color value of the left adjacent dark brown/blue pixel 304 which was previously changed to the RGB color value of the brown pixel 303. The brown pixel 303 is the first pixel in the run, and is followed by the dark brown/blue pixel 304 and the dark blue pixel 305. Pixels 304 and 305 now have the same RGB color value as pixel 303.

The image filtering algorithm 284 now moves onto the next pixel (light blue pixel 306) and performs the same steps as above, except this time with the left adjacent dark blue pixel 305. At this point in the algorithm 284, the light blue pixel 306 becomes the current pixel and the dark blue pixel 305 becomes the prior pixel. The RGB Euclidian geometric distance is calculated between the current pixel and the prior pixel. In this example, the RGB Euclidian geometric distance is above the threshold, so the light blue pixel 306 is not combined into the run. This marks the end of the run and left pixel run counter is reset to 0.

The above steps show how the three middle pixels of similar blue/brown shades (i.e., pixels 303, 304, 305) in the first row of pixels in the letter "a" 300 are combined to form a run of three identical pixels having the same RGB color value. The run length encoding with the image filtering technique advantageously removes shade variations of neighboring pixels to reduce complexity of the overall image and to also increase the number of repeating pixels. Encoding the three middle pixels with the same RGB color value requires fewer bits as compared to encoding three unique RGB color values in the original image.

In addition, the threshold used to compare to the calculated RGB Euclidean geometric distances may be chosen such that any changes are imperceptible to the human eye but give an overall reduction in number of encoded bits generated. The thresholds are configurable as readily appreciated by those skilled in the art. For example, the threshold may be chosen so that there is an overall reduction of 10-15% in the number of encoded bits generated.

The image filtering algorithm 284 continues until all pixels have been processed in the manner described above. In addition, the algorithm 284 is further configured so that if the pixel currently being examined does not meet the left-pixel/right-pixel distance threshold, then a further distance check is done with the bottom pixel. If the top and bottom distances are within the threshold, the bottom pixel is combined with the top pixel, forming a vertical up-run instead of a horizontal left-run. Here, in the same manner as the left run pixel count, a vertical run pixel counter is also maintained and the run is terminated if the counter is above the maximum combine count (e.g., 4 pixels).

Figure 4:
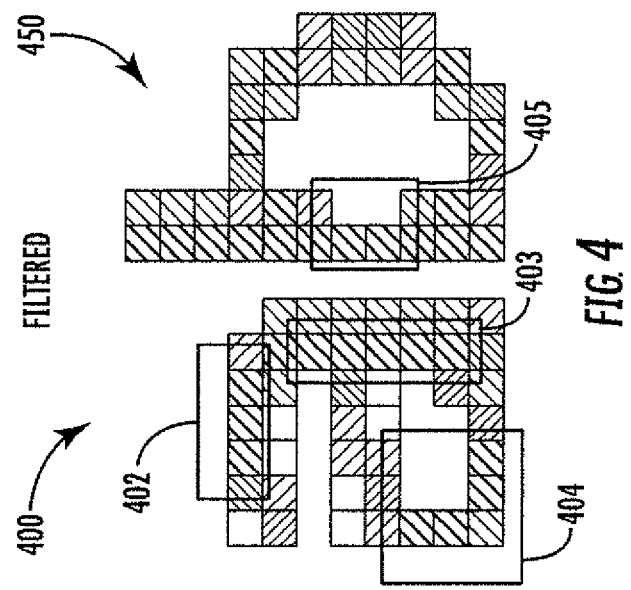
FIG. 4 is a bitmap of the letters "ab" after image filtering by the encoder illustrated in FIG. 2.

Referring now to FIG. 4, a filtered image of the letter "a" 400 and the letter "b" 450 is provided, where the rectangles 401-405 indicate where the pixels have been combined to have the same RGB color value. As noted above, the processor 280 limits how many successive pixels are being changed to have the same RGB color value. This is needed to prevent pixels being combined indefinitely and losing all detail in the image. The successive pixels may have the same RGB color value in a horizontal direction as indicated by rectangle 402, and in a vertical direction as indicated by rectangle 402. The successive pixels may also have the same RGB color value in both a horizontal direction and in a vertical run as indicated by rectangles 404 and 405.

The image filtering thus removes a portion of shade variations in the digital image before being encoded, as best illustrated in FIG. 4. Each removed shade variation is replaced by a run of pixels having the same RGB color value, the results of which are imperceptible to the human eye at normal viewing levels. Runs of repeating pixels advantageously increase the efficiency of the encoder 270 since fewer bits are to be encoded, which also reduces the bandwidth while offering near-lossless imagery.

Figure 5:
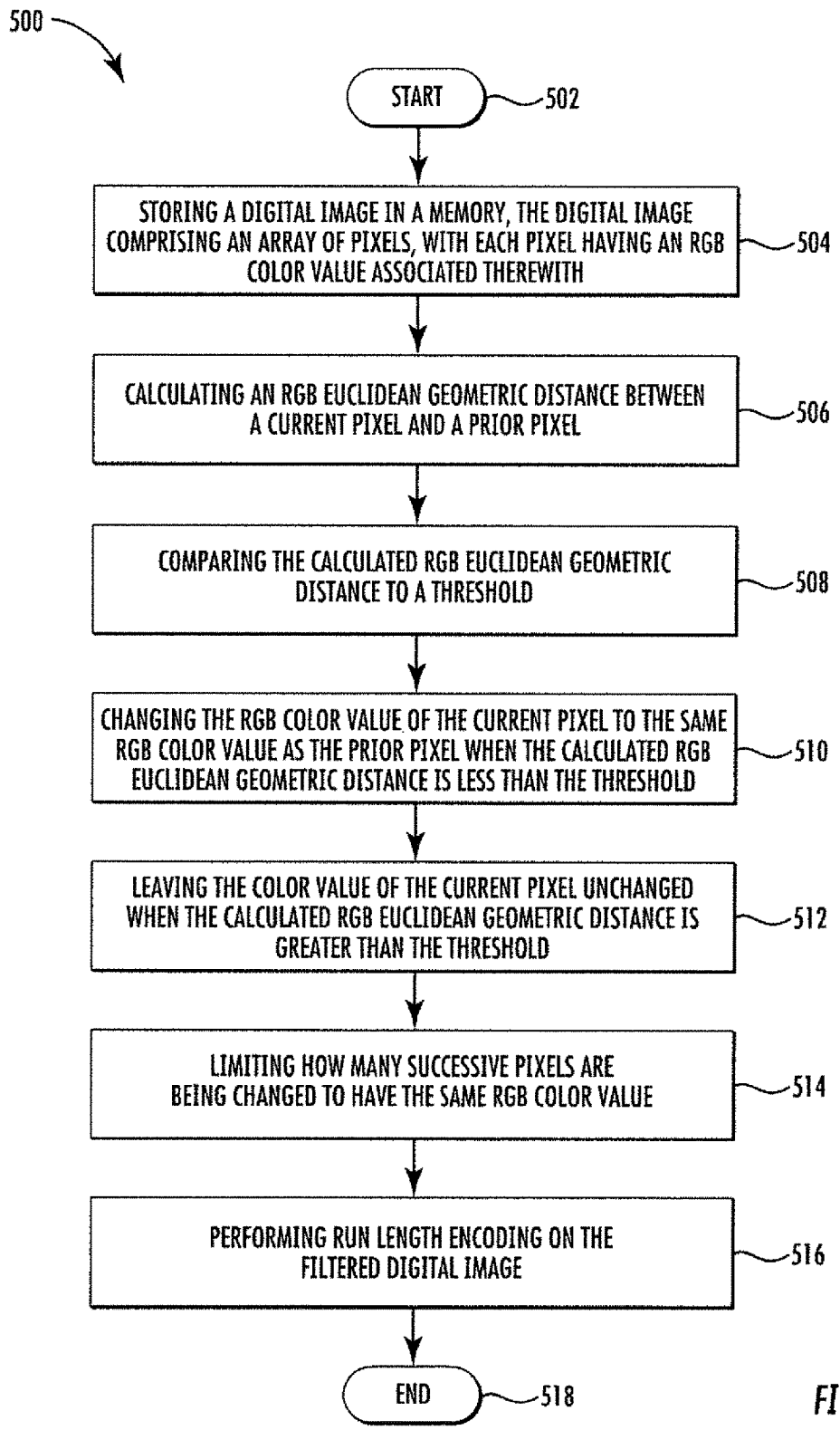
FIG. 5 is a flowchart illustrating a method for encoding a digital image with the encoder illustrated in FIG. 2.

Referring now to the flowchart 500 in FIG. 5, another aspect is directed to a method for encoding a digital image. From the start (Block 502), the method includes storing a digital image in a memory 290 at Block 504. The digital image includes an array of pixels, with each pixel having an RGB color value associated therewith. Image filtering is then performed on the digital image. An RGB Euclidean geometric distance between a current pixel and a prior pixel is calculated at Block 506. The calculated RGB Euclidean geometric distance is compared to a threshold at Block 508. The RGB color value of the current pixel is changed to the same RGB color value as the prior pixel at Block 510 when the calculated RGB Euclidean geometric distance is less than the threshold. The color value of the current pixel is left unchanged at Block 512 when the calculated RGB Euclidean geometric distance is greater than the threshold. The method further includes limiting at Block 514 how many successive pixels are being changed to have the same RGB color value. Run length encoding may then be performed on the filtered digital image at Block 516. The method ends at Block 518.

Yet another aspect is directed to a non-transitory computer readable medium having a plurality of computer executable instructions for causing an encoder 270 to perform steps that include storing a digital image to be encoded, with the digital image comprising an array of pixels, and with each pixel having an RGB color value associated therewith. Image filtering may be performed on the digital image comprising calculating an RGB Euclidean geometric distance between a current pixel and a prior pixel, comparing the calculated RGB Euclidean geometric distance to a threshold, and changing the RGB color value of the current pixel to the same RGB color value as the prior pixel when the calculated RGB Euclidean geometric distance is less than the threshold. Run length encoding may then be performed on the filtered digital image.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the foregoing description.

That which is claimed:

1. An encoder comprising:
   a processor and a memory coupled thereto and configured to
      store a digital image to be encoded in said memory, the digital image comprising an array of pixels, with each pixel having an RGB color value associated therewith,
      perform image filtering on the digital image comprising
         calculate an RGB Euclidean geometric distance between a current pixel and a prior pixel based on an approximation, with the approximation being based on the following equation:

$\text{Distance} = W1|R_X - R_Y| + W2|G_X - G_Y| + W3|B_X - B_Y|$ where $R_X$, $G_X$ and $B_X$ are the respective red, green and blue color values for the prior pixel,
      where $R_Y$, $G_Y$ and $B_Y$ are the respective red, green and blue color values for the current pixel, and
      W1, W2 and W3 are weighting factors, with the weighting factor W2 for the green color values being greater than the weighting factors W1, W3 for the red and blue color values,
      compare the calculated RGB Euclidean geometric distance to a threshold, and
      change the RGB color value of the current pixel to the same RGB color value as the prior pixel when the calculated RGB Euclidean geometric distance is less than the threshold, and
   perform run length encoding on the filtered digital image.

2. The encoder according to claim 1 wherein when the calculated RGB Euclidean geometric distance is greater than the threshold, then said processor leaves the color value of the current pixel unchanged.

3. The encoder according to claim 1 wherein said processor is further configured to limit how many successive pixels are being changed to have the same RGB color value.

4. The encoder according to claim 3 wherein the successive pixels having the same RGB color value are in a horizontal direction.

5. The encoder according to claim 3 wherein the successive pixels having the same RGB color value are in a vertical direction.

6. The encoder according to claim 1 wherein said processor is configured to perform the image filtering in two-dimensions.

7. The encoder according to claim 1 wherein said processor is configured to perform the image filtering in a top-left to bottom-right order.

8. A method for encoding a digital image comprising:
operating a processor and a memory coupled thereto to perform steps comprising
storing the digital image in the memory, the digital image comprising an array of pixels, with each pixel having an RGB color value associated therewith,
performing image filtering on the digital image comprising
calculating an RGB geometric distance between a current pixel and a prior pixel based on an approximation, with the approximation being based on the following equation:

$$\text{Distance} = W1|R_X - R_Y| + W2|G_X - G_Y| + W3|B_X - B_Y|$$

where $R_X$, $G_X$ and $B_X$ are the respective red, green and blue color values for the prior pixel,
where $R_Y$, $G_Y$ and $B_Y$ are the respective red, green and blue color values for the current pixel, and
W1, W2 and W3 are weighting factors, with the weighting factor W2 for the green color values being greater than the weighting factors W1, W3 for the red and blue color values,
comparing the calculated RGB Euclidean geometric distance to a threshold, and
changing the RGB color value of the current pixel to the same RGB color value as the prior pixel when the calculated RGB Euclidean geometric distance is less than the threshold, and
performing run length encoding on the filtered digital image.

9. The method according to claim 8 wherein when the calculated RGB Euclidean geometric distance is greater than the threshold, then leaving the color value of the current pixel unchanged.

10. The method according to claim 8 further comprising limiting how many successive pixels are being changed to have the same RGB color value.

11. The method according to claim 10 wherein the successive pixels having the same RGB color value are in a horizontal direction.

12. The method according to claim 10 wherein the successive pixels having the same RGB color value are in a vertical direction.

13. The method according to claim 8 wherein the image filtering is performed in two-dimensions.

14. The method according to claim 8 wherein the image filtering is performed in a top-left to bottom-right order.

15. A non-transitory computer readable medium having a plurality of computer executable instructions for causing a system to perform steps comprising:
storing a digital image to be encoded, the digital image comprising an array of pixels, with each pixel having an RGB color value associated therewith,
performing image filtering on the digital image comprising
calculating an RGB Euclidean geometric distance between a current pixel and a prior pixel based on an approximation, with the approximation being based on the following equation:

$$\text{Distance} = W1|R_X - R_Y| + W2|G_X - G_Y| + W3|B_X - B_Y|$$

where $R_X$, $G_X$ and $B_X$ are the respective red, green and blue color values for the prior pixel,
where $R_Y$, $G_Y$ and $B_Y$ are the respective red, green and blue color values for the current pixel, and
W1, W2 and W3 are weighting factors, with the weighting factor W2 for the green color values being greater than the weighting factors W1, W3 for the red and blue color values,
comparing the calculated RGB Euclidean geometric distance to a threshold, and
changing the RGB color value of the current pixel to the same RGB color value as the prior pixel when the calculated RGB Euclidean geometric distance is less than the threshold, and
performing run length encoding on the filtered digital image.

16. The non-transitory computer readable medium according to claim 15 wherein when the calculated RGB Euclidean geometric distance is greater than the threshold, then leaving the color value of the current pixel unchanged.

17. The non-transitory computer readable medium according to claim 15 further comprising limiting how many successive pixels are being changed to have the same RGB color value.

18. The non-transitory computer readable medium according to claim 15 wherein the image filtering is performed in two-dimensions.

19. The non-transitory computer readable medium according to claim 15 wherein the image filtering is performed in a top-left to bottom-right order.

\* \* \* \* \*